US009640776B2

(12) United States Patent
Choi et al.

(10) Patent No.: US 9,640,776 B2
(45) Date of Patent: May 2, 2017

(54) ORGANIC LIGHT EMITTING DEVICE MANUFACTURING METHOD USING SHADOW MASK AND ORGANIC LIGHT EMITTING DEVICE MANUFACTURED THEREBY

(71) Applicant: KOREA INSTITUTE OF INDUSTRIAL TECHNOLOGY, Chungcheongnam-do (KR)

(72) Inventors: Bum Ho Choi, Gwangju (KR); Jong Ho Lee, Gwangju (KR)

(73) Assignee: KOREA INSTITUTE OF INDUSTRIAL TECHNOLOGY, Chungcheongnam-Do (KR)

( * ) Notice: Subject to any disclaimer, the term of this patent is extended or adjusted under 35 U.S.C. 154(b) by 0 days.

(21) Appl. No.: 14/647,121

(22) PCT Filed: Jan. 14, 2014

(86) PCT No.: PCT/KR2014/000385
§ 371 (c)(1),
(2) Date: May 25, 2015

(87) PCT Pub. No.: WO2014/137068
PCT Pub. Date: Sep. 12, 2014

(65) Prior Publication Data
US 2015/0364714 A1   Dec. 17, 2015

(30) Foreign Application Priority Data
Mar. 7, 2013   (KR) ........................ 10-2013-0024264

(51) Int. Cl.
*H01L 51/52*   (2006.01)
*H01L 51/56*   (2006.01)
(Continued)

(52) U.S. Cl.
CPC ........ *H01L 51/5225* (2013.01); *C23C 14/042* (2013.01); *C23C 14/086* (2013.01);
(Continued)

(58) Field of Classification Search
CPC ........................... H01L 51/56; H01L 51/5225
(Continued)

(56) References Cited

U.S. PATENT DOCUMENTS 6,303,427 B1 * 10/2001 Song ..................... H01L 28/60
257/E21.008
6,656,832 B1 * 12/2003 Pan .................. H01L 21/31116
257/E21.252

(Continued)

FOREIGN PATENT DOCUMENTS

JP   2006216539 A   8/2006
KR   10-2001-0057125 A   7/2001
(Continued)

OTHER PUBLICATIONS

International Search Report for PCT/KR2014/000385.
Office action from Korean Intellectual Property office in a counterpart Korean patent application.

*Primary Examiner* — Christine Enad
(74) *Attorney, Agent, or Firm* — The PL Law Group, PLLC (57) ABSTRACT

The present inventions relates to an organic light emitting device capable of decreasing a leakage current, and more particularly, to an organic light emitting device manufacturing method and an organic light emitting device using the same, which can decrease a leakage current, by flattening a lower electrode in order to decrease a leakage current of the lower electrode deposited through a shadow mask.

5 Claims, 5 Drawing Sheets

(51) Int. Cl.
  *C23C 14/04* (2006.01)
  *C23C 14/08* (2006.01)
  *C23C 14/58* (2006.01)
  *H01L 51/00* (2006.01)

(52) U.S. Cl.
  CPC ........ *C23C 14/584* (2013.01); *C23C 14/5853* (2013.01); *H01L 51/0011* (2013.01); *H01L 51/5206* (2013.01); *H01L 51/56* (2013.01)

(58) Field of Classification Search
  USPC .......................................................... 257/40
  See application file for complete search history.

(56) References Cited

U.S. PATENT DOCUMENTS

| | | | | |
|---|---|---|---|---|
| 6,724,051 B1* | 4/2004 | Woo | .................... | H01L 29/4983 257/382 |
| 2003/0047771 A1* | 3/2003 | Kweon | .................... | H01L 28/60 257/306 |
| 2006/0183394 A1* | 8/2006 | Kim | .................... | H01L 27/3246 445/24 |
| 2008/0062112 A1* | 3/2008 | Umezaki | ........... | H01L 29/78693 345/100 |
| 2011/0129951 A1* | 6/2011 | Kondo | ................. | H01L 51/0017 438/26 |
| 2011/0193053 A1* | 8/2011 | Roca I Cabarrocas | ............ | B82Y 10/00 257/9 |
| 2011/0287591 A1* | 11/2011 | Yamazaki | ......... | H01L 21/02554 438/158 |
| 2011/0287620 A1* | 11/2011 | Xu | .................... | H01L 21/02181 438/591 |
| 2012/0248490 A1* | 10/2012 | Weng | ...................... | H01L 33/38 257/99 |
| 2012/0286650 A1* | 11/2012 | Pang | ...................... | C23C 14/24 313/504 |
| 2014/0183432 A1* | 7/2014 | Barabash | ................ | H01L 45/08 257/2 |

FOREIGN PATENT DOCUMENTS

| | | |
|---|---|---|
| KR | 10-2003-0057632 A | 7/2003 |
| KR | 10-2005-0110541 A | 11/2005 |

* cited by examiner

ORGANIC LIGHT EMITTING DEVICE MANUFACTURING METHOD USING SHADOW MASK AND ORGANIC LIGHT EMITTING DEVICE MANUFACTURED THEREBY

CROSS REFERENCE TO RELATED APPLICATIONS AND CLAIM OF PRIORITY

This patent application is a National Phase application under 35 U.S.C. §371 of International Application No. PCT/KR2014/000385, filed Jan. 14, 2014, which claims priority to Korean Patent Application No. 10-2013-0024264, filed Mar. 07, 2013, entire contents of which are incorporated herein by reference.

TECHNICAL FIELD

The present invention relates to an organic light emitting device and a manufacturing method thereof, and more particularly, to a method of manufacturing an organic light emitting device and an organic light emitting device manufactured thereby, wherein the organic light emitting device manufactured using a shadow mask may be reduced in leakage current.

BACKGROUND ART

An organic light emitting device includes a light emitting layer made of an organic material, and has electrical properties similar to those of a diode. Such an organic light emitting device is a display based on the principle in that, when voltage is applied between a lower electrode and an upper electrode, between which a plurality of organic layers is formed, electrons and holes are injected from a cathode and an anode and then recombined in the organic layer to produce light.

An organic light emitting device is advantageous in terms of its wide viewing angle, ultra-high speed response and self-lighting characteristics, and may thus be utilized as any video display medium from a small size to a large size. Furthermore, because of low power consumption and no need for a backlight, such a device may be manufactured to be lightweight and slim and is very suitable for use in a flat panel display.

When the lower electrode is formed so as to possess good electrical properties and to be uniform and flat before formation of an organic film, which is a light emitting portion of the organic light emitting device, it is possible to manufacture an organic light emitting device having high efficiency without shorting of the device.

In an existing organic light emitting device, forming a lower electrode and an insulating film may be carried out by deposition and etching, and an organic layer and an upper electrode are formed using a vacuum process. Recently, however, a technique for manufacturing an organic light emitting device using a shadow mask has been developed, thus simplifying the manufacturing process.

However, the organic light emitting device using a shadow mask as recently developed is problematic because the surface of a transparent electrode on a substrate is not flat, and thereby leakage current of the organic light emitting device may occur and electrical properties of the device may deteriorate or shorting of the device may be caused.

SUMMARY

Culminating in the present invention, intensive and thorough research carried out by the present inventors aiming to solve the problems encountered in the related art, led to development of techniques for reducing leakage current via surface treatment of a lower electrode.

Accordingly, an object of the present invention is to provide a method of manufacturing an organic light emitting device (OLED) and an organic light emitting device manufactured thereby, wherein a deposition process may be performed using a shadow mask, thereby shortening the process time to ultimately achieve mass production, low manufacturing cost, and a reduction of leakage current.

Another object of the present invention is to provide a method of manufacturing an organic light emitting device, which may prevent shorting of the device.

Still another object of the present invention is to provide a method of manufacturing an organic light emitting device having improved electrical properties.

In order to accomplish the above objects, the present invention provides a method of manufacturing an organic light emitting device, comprising: preparing a substrate; providing a shadow mask on the substrate; depositing a lower electrode on the substrate having the shadow mask to form a lower electrode layer; flattening the lower electrode layer; depositing an organic material on the flattened lower electrode layer to form an organic layer; and depositing an upper electrode on the organic layer to form an upper electrode layer.

In a preferred embodiment, the method further comprises depositing an insulating film on the flattened lower electrode layer.

In a preferred embodiment, the flattening is performed by one or more of thermal treatment and plasma treatment.

In a preferred embodiment, the thermal treatment is performed at 250~400° C.

In a preferred embodiment, the plasma treatment is performed by one or more of argon (Ar) plasma treatment and oxygen plasma treatment.

In a preferred embodiment, the insulating film is any one selected from among PI (Polyimide), $Al_2O_3$, $SiO_2$ and $SiN_x$ insulating films.

In a preferred embodiment, the lower electrode layer is an ITO (Indium Tin Oxide) film layer.

In addition, the present invention provides an organic light emitting device manufactured by the method as above.

According to the present invention, the following effects can be manifested.

Specifically, an organic light emitting device according to the present invention can be reduced in leakage current with the use of a shadow mask, thus achieving mass production and low manufacturing cost while exhibiting similar properties to those of an organic light emitting device manufactured conventionally.

Also, a lower electrode of the device can be subjected to a flattening process, thereby preventing shorting of the device.

Also, a process of depositing an insulating film is carried out, thereby improving electrical properties.

DETAILED DESCRIPTION

Although the terms used in the present invention are possibly selected from among currently well-known terms, some of the terms mentioned in the description of the present invention have been selected by the applicant, the detailed meanings of which should be understood not simply by the actual terms used but by the meaning of each term in the detailed description of the invention or in consideration of the meanings used.

Hereinafter, a detailed description will be given of technical construction of the present invention with reference to the appended drawings and the preferred embodiments.

The first technical feature of the present invention is that a lower electrode is deposited using a shadow mask and then flattened, thereby simplifying the manufacturing process, preventing shorting of the device and reducing leakage current.

Useful in the present invention, a shadow mask is an alternative to conventional deposition and etching for forming a lower electrode layer and an insulating film.

When the lower electrode layer and the insulating film of the organic light emitting device are deposited using a shadow mask instead of etching, the manufacturing cost of the organic light emitting device may be lowered and mass production is possible. As such, however, the lower electrode is not evenly deposited, undesirably causing problems of shorting of the device, generation of leakage current and deterioration of electrical properties of the device.

In order to solve such problems in the present invention, a shadow mask is applied upon patterning the lower electrode and the insulating film of the organic light emitting device, so that a pattern is formed at the same time as deposition, after which flattening of the surface of the deposited lower electrode layer is carried out, ultimately improving electrical properties of the organic light emitting device and characteristics of the device.

Therefore, the method of manufacturing the organic light emitting device according to the present invention comprises: preparing a substrate; providing a shadow mask on the substrate; depositing a lower electrode on the substrate having the shadow mask to form a lower electrode layer; flattening the lower electrode layer; depositing an organic material on the flattened lower electrode layer to form an organic layer; and depositing an upper electrode on the organic layer to form an upper electrode layer.

In preparing the substrate, the substrate may be any one selected from among transparent substrates, including a glass substrate, a flexible substrate and a semiconductor substrate.

Next, providing the shadow mask on the substrate is a process of positioning a shadow mask by a predetermined distance on the substrate. The shadow mask may be made of either a metal or glass, and a shadow mask having a desired pattern is introduced so that the substrate is patterned.

Next, depositing the lower electrode on the substrate having the shadow mask to form the lower electrode layer is performed in such a manner that an inorganic material is vacuum deposited on the substrate through the open portion of the shadow mask having a predetermined pattern. The lower electrode layer may include a variety of inorganic materials. Useful in the present invention is ITO (Indium Tin Oxide) having good electrical conductivity.

Next, flattening the lower electrode has an important influence on performance of the organic light emitting device because surface resistance and leakage current may be minimized when manufacturing the organic light emitting device. Shorting of the device and generation of leakage current may be prevented only when the surface of the lower electrode of the organic light emitting device is deposited flat. When the surface of the lower electrode is not flat, an organic layer deposited in the subsequent step may be perforated with the lower electrode. This causes the shorting of the organic light emitting device and the generation of leakage current.

Although flattening the lower electrode according to the present invention may be variously performed, one or more of thermal treatment and plasma treatment may be carried out.

As such, thermal treatment may be performed at 250~400° C.

If thermal treatment is performed at a temperature lower than 250° C., improvements in flattening of the surface of the lower electrode may become insignificant due to almost no effects of the thermal treatment, and thus there is no reduction in the leakage current of the organic light emitting device. In contrast, if thermal treatment is performed at a temperature higher than 400° C., thermal impact is applied to the glass substrate and thus degeneration of the glass may occur, making it impossible to manufacture the organic light emitting device.

When the lower substrate is thermally treated in this way, recrystallization in the lower electrode film occurs and energy is moved to the low level from the high level, so that flattening is achieved.

On the other hand, plasma treatment is performed using any one of argon (Ar) plasma and oxygen plasma.

As the lower electrode undergoes plasma treatment, a spike structure is detached from the surface of the lower electrode film, thus completing the flattening of the lower electrode. Thereby, the value of leakage current may be decreased.

Upon plasma treatment, if the power of plasma is too low, the effect of etching an over-deposited material on the lower electrode film may decrease. In contrast, if the power of plasma is too high, not only the over-deposited material but also the lower electrode film may be directly damaged, and thus quality of the organic light emitting device may deteriorate.

Hence, upon plasma treatment, argon (Ar) plasma may be used at a power of 400~600 W, and oxygen plasma may be employed at a power of 100~200 W.

Next, in depositing the organic material on the flattened lower electrode layer to form the organic layer, light emission is carried out on the lower electrode film, and the organic layer is deposited via evaporation.

Next, depositing the upper electrode to form the upper electrode layer is a process of depositing a metal layer as a cathode on the organic layer. To this end, any metal may be used, but aluminum (Al) may be applied in an embodiment of the present invention.

The second technical feature of the present invention is to provide a method of manufacturing an organic light emitting device, wherein depositing an insulating film is performed to thereby improve electrical properties.

When depositing the insulating film on the organic light emitting device is performed in this way, such a film may function to prevent the leakage current generated from the lower electrode from being transferred to the other upper layer.

In the present invention, the insulating film may be deposited using any one selected from among PI (Polyimide), $Al_2O_3$, $SiO_2$ and $SiN_x$, and the thickness thereof may be 50~300 nm.

When flattening the lower electrode and depositing the insulating film are conducted as mentioned above, the resulting leakage current may be similar to or lower than that of an existing organic light emitting device having a lower electrode layer and an insulating film formed by an etching process, as will be described in the following test examples.

EXAMPLES 1 to 8

Lower electrodes of Examples 1 to 8 were deposited using a shadow mask under the process conditions as shown in Table 1 below. In the course of flattening, argon (Ar) plasma treatment and oxygen plasma treatment are shown in Table 2 below.

TABLE 1

| Class. | Changes in Surface treatment conditions | Temperature (° C.) | Time (Hr) |
|---|---|---|---|
| Ex. 1 | As-dep.(with mask) + RTA(250) | 250 | 1 |
| Ex. 2 | As-dep.(with mask) + RTA(380) | 380 | 1 |
| Ex. 3 | As-dep.(with mask) + $O_2$ PT | — | 1 |
| Ex. 4 | As-dep.(with mask) + Ar PT | — | 1 |
| Ex. 5 | As-dep.(with mask) + RTA(250) + $O_2$ PT | 250 | |
| Ex. 6 | As-dep.(with mask) + RTA(380) + $O_2$ PT | 380 | |
| Ex. 7 | As-dep.(with mask) + RTA(250) + Ar PT | 250 | |
| Ex. 8 | As-dep.(with mask) + RTA(380) + Ar PT | 380 | |

TABLE 2

| Class. | $O_2$ | Ar |
|---|---|---|
| RF power(W) | 150 W | 150 W |
| Ar flow(sccm) | — | 100 |
| $O_2$ flow(sccm) | 50 | — |
| Pressure(mtorr) | 20 | 10 |
| Time(sec) | 90 | 180 |

COMPARATIVE EXAMPLE 1

A lower electrode of Comparative Example 1 was deposited using a shadow mask under the process conditions as shown in Table 3 below.

TABLE 3

| Class. | Changes in Surface treatment conditions | Temperature (° C.) | Time (Hr) |
|---|---|---|---|
| C. Ex. 1 | As-dep.(with mask) | — | 1 |

COMPARATIVE EXAMPLE 2

A lower electrode of Comparative Example 2 was formed using a conventional method of manufacturing an organic light emitting device. This lower electrode was manufactured in such a manner that a lower electrode film was deposited on a glass substrate and then etched by photolithography.

TEST EXAMPLE 1

Figure 1:
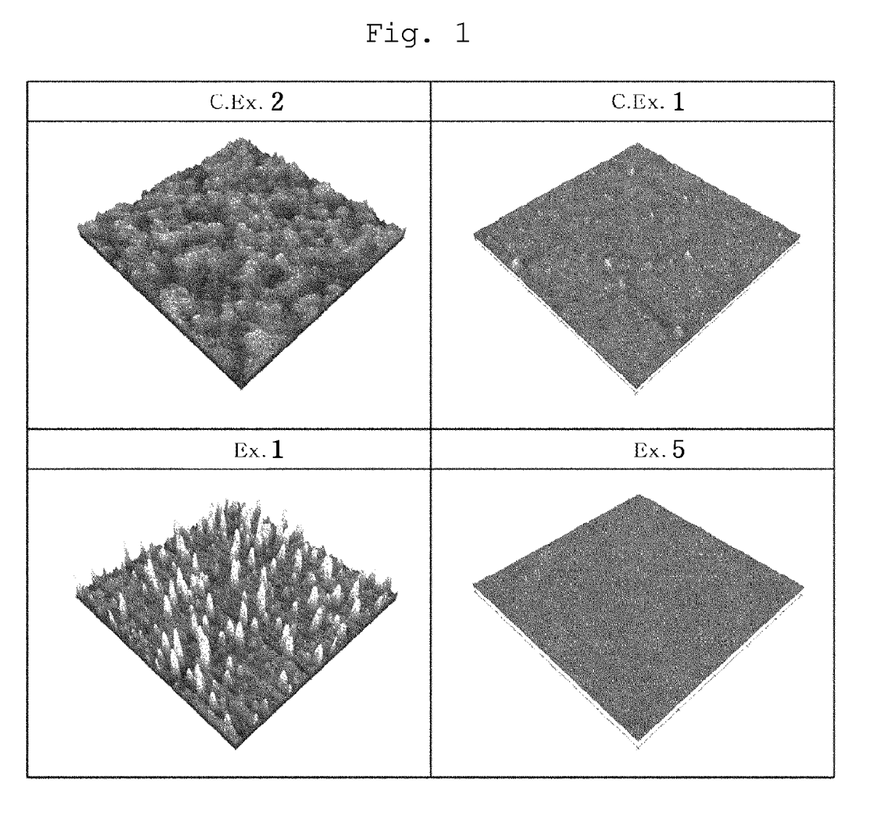
FIG. 1 illustrates AFM images after surface treatment under DC+RF power conditions according to the present invention.

AFM measurement of the lower electrodes of Comparative Examples 1 and 2 and the lower electrodes of Examples 1 and 5 obtained by a deposition process at 250° C. under DC+RF power conditions was performed. The results of $R_a$, $R_{PV}$ and leakage current of the surfaces of the lower electrode films are shown in Table 4 below and FIG. 1. As such, $R_a$ (average ratio) indicates an average numerical value of the surface roughness of the lower electrode film, and $R_{PV}$ (peak to valley ratio) indicates a numerical value showing a difference between the highest portion and the lowest portion of the surface roughness of the lower electrode film.

TABLE 4

| Class. | Changes in Surface treatment conditions | Leakage current (mA/cm$^2$) | Ave. $R_a$ (Ω/□) | $R_{PV}$ (nm) |
|---|---|---|---|---|
| C. Ex. 1 | As-dep.(with mask) | 3.12 | 1.587 | 22.512 |
| C. Ex. 2 | Existing lower electrode (Ref.) | 0.197 | 1.202 | 11.447 |
| Ex. 1 | As-dep.(with mask) + RTA(250) | 2.45 | 0.329 | 7.644 |
| Ex. 5 | As-dep.(with mask) + RTA(250) + $O_2$ PT | 1.84 | 0.169 | 3.877 |

As is apparent from Table 4, compared to the lower electrode of Comparative Example 2 manufactured using the conventional deposition process, in the lower electrode of Comparative Example 1 deposited using the shadow mask, $R_{PV}$ (nm) was almost doubled and the value of leakage current was drastically increased.

However, in the lower electrode of Example 1 thermally treated at 250° C., the values of $R_{PV}$ (nm) and leakage current were decreased. In the lower electrode of Example 5 subjected to both thermal treatment at 250° C. and oxygen plasma treatment, these numerical values were further lowered.

Thereby, the flattening process of the lower electrode, that is, 250° C. thermal treatment and oxygen plasma treatment, can lower the surface roughness of the lower electrode and can also reduce the leakage current.

TEST EXAMPLE 2

Figure 2:
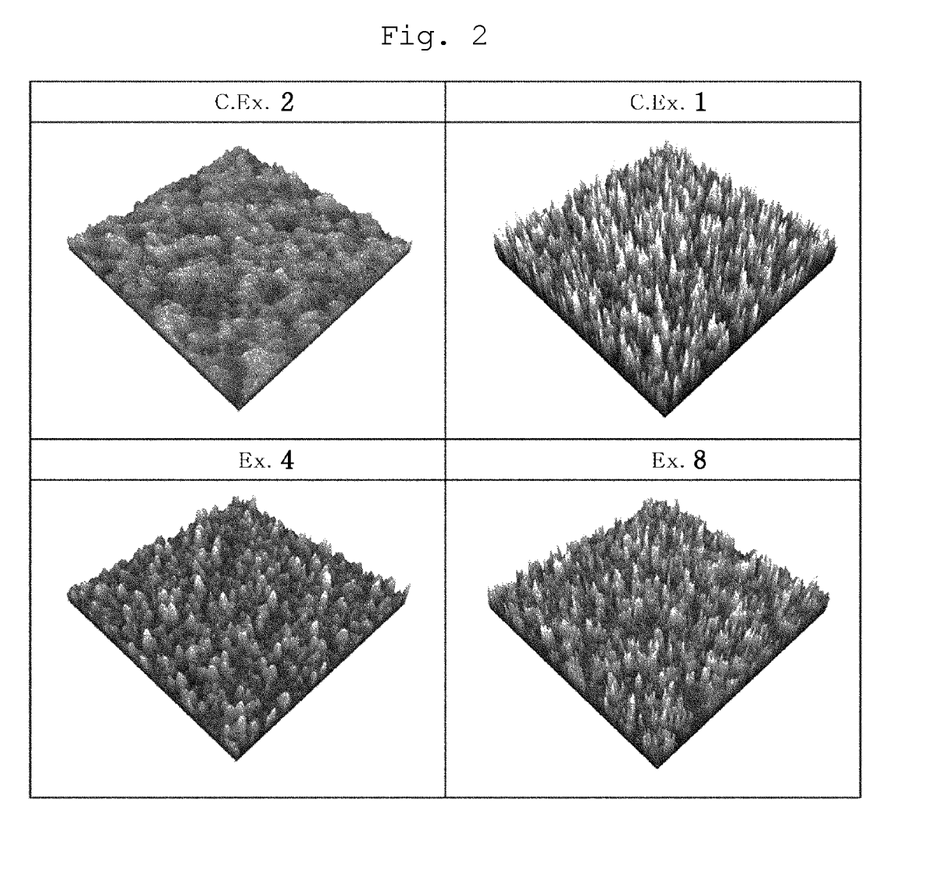
FIG. 2 illustrates AFM images after surface treatment under PF power conditions according to the present invention.

AFM measurement of the lower electrodes of Comparative Examples 1 and 2 and the lower electrodes of Examples 4 and 8 obtained by a deposition process at 380° C. under RF power conditions was performed. The results of $R_a$, $R_{PV}$ and leakage current of the surfaces of the lower electrode films are shown in Table 5 below and FIG. 2. As such, $R_a$ (average ratio) indicates an average numerical value of the surface roughness of the lower electrode film, and $R_{PV}$ (peak to valley ratio) indicates a numerical value showing a difference between the highest portion and the lowest portion of the surface roughness of the lower electrode film.

TABLE 5

| Class. | Changes in Surface treatment conditions | Leakage current (mA/cm$^2$) | Ave. $R_a$ (Ω/□) | $R_{PV}$ (nm) |
|---|---|---|---|---|
| C. Ex. 1 | As-dep.(with mask) | 3.24 | 2.294 | 26.164 |
| C. Ex. 2 | Existing lower electrode (Ref.) | 0.215 | 1.202 | 11.447 |

TABLE 5-continued

| Class. | Changes in Surface treatment conditions | Leakage current (mA/cm$^2$) | Ave. $R_a$ ($\Omega/\square$) | $R_{PV}$ (nm) |
|---|---|---|---|---|
| Ex. 4 | As-dep.(with mask) + Ar PT | 1.83 | 2.066 | 23.247 |
| Ex. 8 | As-dep.(with mask) + RTA(380) + Ar PT | 0.273 | 1.708 | 15.644 |

As is apparent from Table 5, compared to the lower electrode of Comparative Example 1 deposited using the shadow mask, in the lower electrode of Example 4 subjected to argon (Ar) plasma treatment, the values of $R_{PV}$ (nm) and leakage current were insignificantly decreased. However, in the lower electrode of Example 8 further subjected to 380° C. thermal treatment, $R_{PV}$ (nm) was decreased by about 50% and the leakage current was drastically lowered.

Thereby, the flattening process of the lower electrode, that is, 380° C. thermal treatment and argon (Ar) plasma treatment, can lower the surface roughness of the lower electrode and can also reduce the leakage current.

TEST EXAMPLE 3

To more specifically evaluate the properties of the lower electrode depending on changes in thermal treatment conditions for flattening the lower electrode, the lower electrode film was deposited to a thickness of 150 nm at a deposition temperature of 250° C. under DC+RF power conditions, after which thermal treatment at 250° C. and 380° C. and oxygen plasma treatment were carried out. The results of $R_s$, $R_{PV}$ and leakage current of the surfaces of the lower electrode films are shown in Table 7 below and FIG. 3. The process of depositing an ITO film as the lower electrode is given in Table 6 below.

TABLE 6

| Class. | DC + RF power |
|---|---|
| Power(W) | DC 300 WRF 350 W |
| Base pressure(Pa) | 5.37 × 10$^{-7}$ |
| Working pressure(mTorr) | 1.2 |
| Ar flow rate (sccm) | 100 |
| O$_2$ flow rate (sccm) | 0.5 |
| Å Thickness (Å) | 1500 |
| Dep. rate (Å/Sec) | 2.3 |

TABLE 7

| Class. | Changes in Surface treatment conditions | Leakage current (mA/cm$^2$) | Ave. $R_s$ ($\Omega/\square$) | $R_{PV}$ (nm) |
|---|---|---|---|---|
| C. Ex. 1 | As-dep.(with mask) | 3.16 | 30.86 | 19.419 |
| Ex. 3 | As-dep.(with mask) + O$_2$ PT | 0.297 | 30.58 | 15.077 |
| Ex. 1 | As-dep.(with mask) + RTA(250) | 2.45 | 28.57 | 15.887 |
| Ex. 5 | As-dep.(with mask) + RTA(250) + O$_2$ PT | 0.212 | 28.53 | 11.415 |
| Ex. 2 | As-dep.(with mask) + RTA(380) | 1.84 | 15.55 | 16.944 |
| Ex. 6 | As-dep.(with mask) + RTA(380) + O$_2$ PT | 0.133 | 15.42 | 12.874 |

Figure 3:
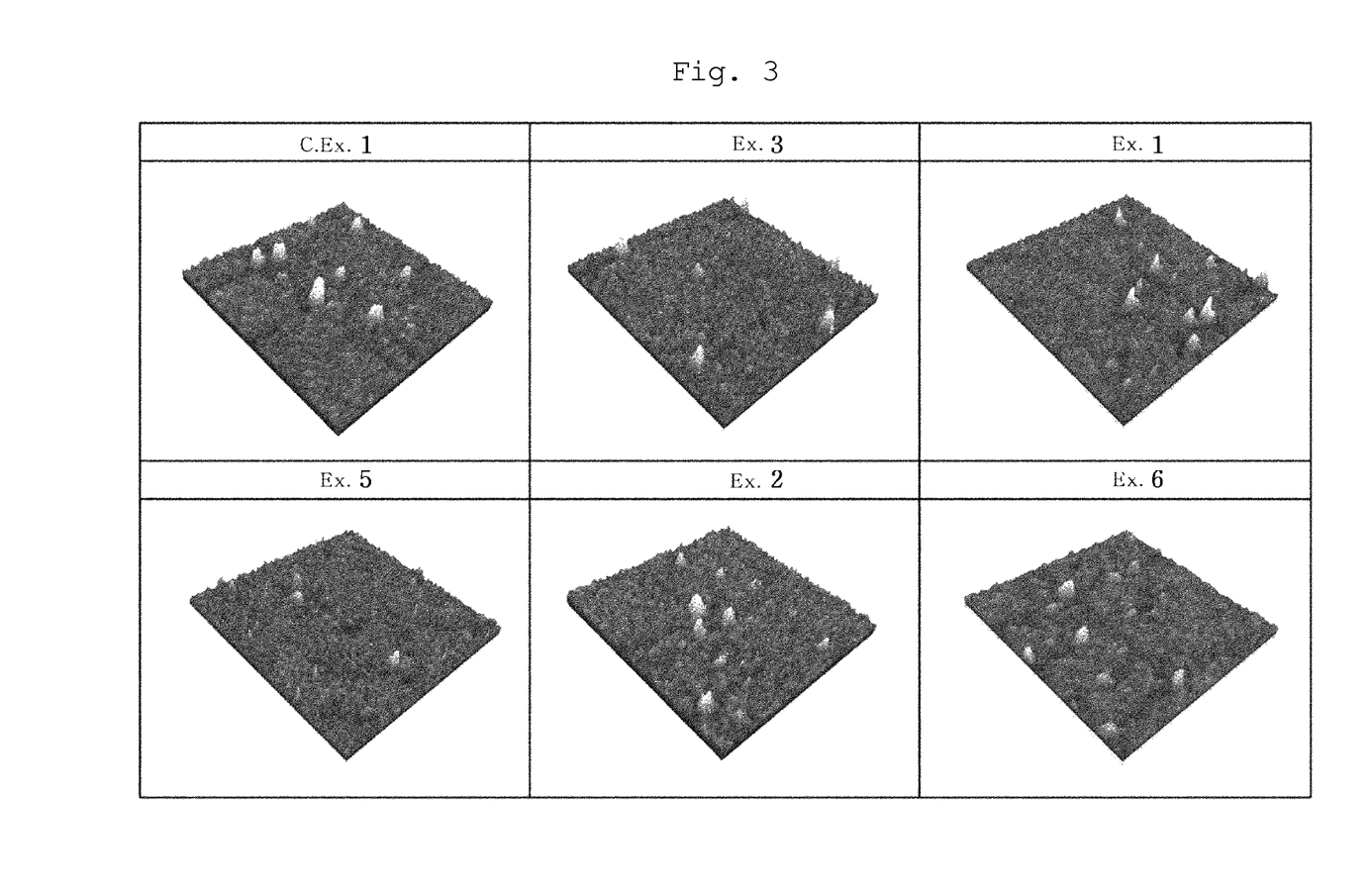
FIG. 3 illustrates AFM images of a lower electrode depending on changes in surface treatment conditions according to the present invention.

As is apparent from Table 7 and FIG. 3, compared to the lower electrode of Comparative Example 1, in the lower electrode of Example 2 subjected to thermal treatment at 380° C., the values of leakage current and $R_s$ ($\Omega/\square$) were decreased by about 50%.

Compared to the lower electrode of Comparative Example 1, in the lower electrode of Example 3 subjected to oxygen plasma treatment, the leakage current was drastically decreased.

Thus, when both thermal treatment and plasma treatment are simultaneously conducted, the surface of the lower electrode can be flattened and thus the leakage current can be reduced.

TEST EXAMPLE 4

Figure 4:
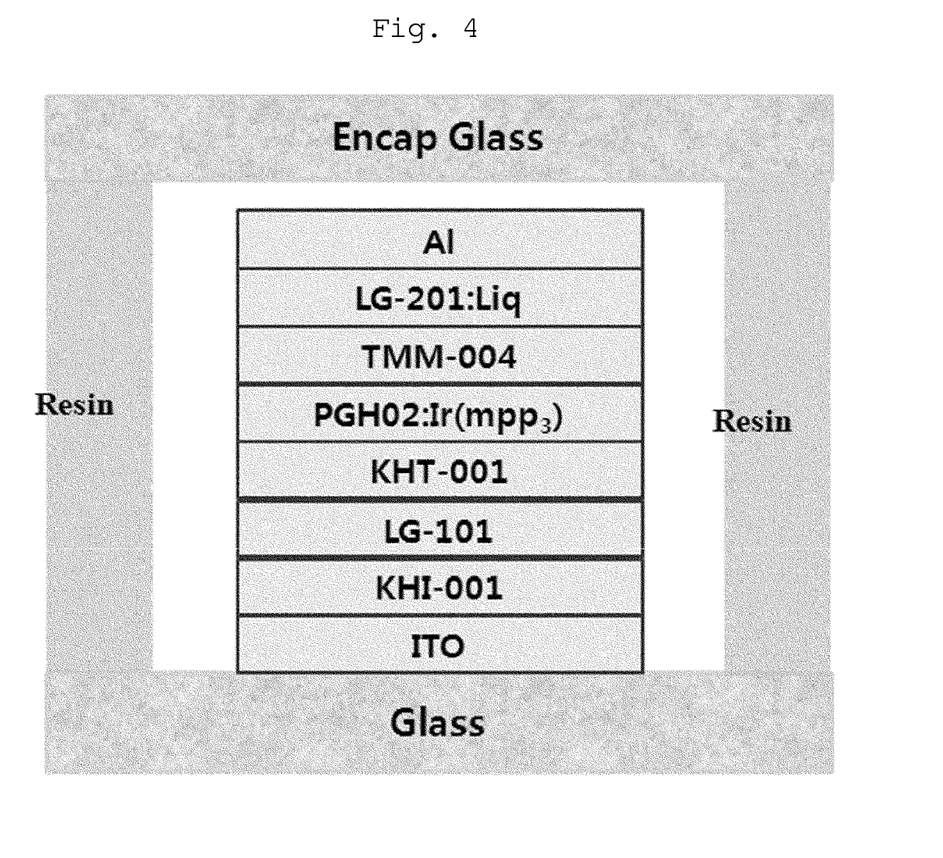
FIG. 4 illustrates the structure of an OLED manufactured using a surface-treated lower electrode according to the present invention.

OLEDs were manufactured using the lower electrodes of Comparative Example and Examples as shown in Table 7. The structure of the OLED is illustrated in FIG. 4, and the graph of the results of measurement of leakage current is depicted in FIG. 5.

Figure 5:
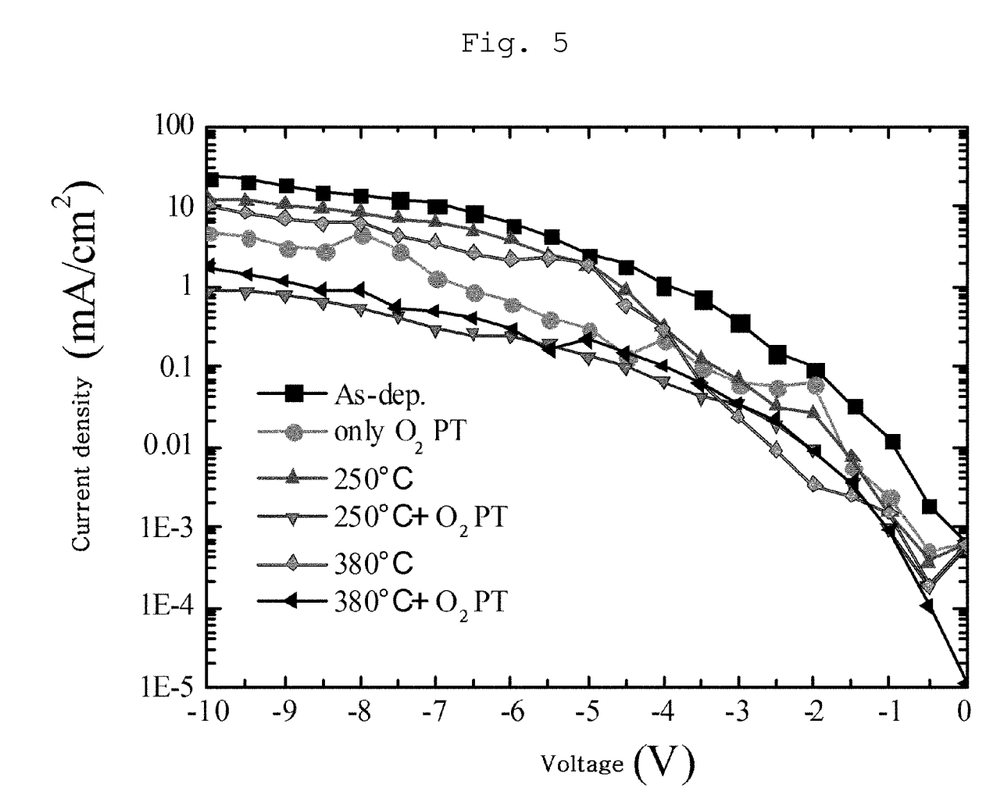
FIG. 5 illustrates a graph of the results of measurement of leakage current depending on changes in surface treatment conditions according to the present invention.

As illustrated in FIG. 5, in the lower electrode of Comparative Example 1 and the lower electrodes of Examples using the flattening process, when both 380° C. thermal treatment and oxygen plasma treatment were simultaneously performed, the leakage current properties were improved.

Therefore, when both thermal treatment and plasma treatment are simultaneously implemented, the leakage current properties are measured to improve. This is considered to be due to the reduction in over peak and surface roughness of the lower electrode by virtue of the flattening process of the lower electrode.

Although the preferred embodiments of the present invention have been disclosed for illustrative purposes, those skilled in the art will appreciate that various modifications and substitutions are possible, without departing from the scope and spirit of the invention as disclosed in the accompanying claims.

INDUSTRIAL APPLICABILITY

The present invention relates to an organic light emitting device and a manufacturing method thereof, and more particularly, to a method of manufacturing an organic light emitting device and an organic light emitting device manufactured thereby, wherein the organic light emitting device manufactured using a shadow mask can be reduced in leakage current, and therefore, the present invention is industrially applicable.

The invention claimed is:

1. A method of manufacturing an organic light emitting device, comprising:
   preparing a substrate;
   providing a shadow mask on the substrate;
   depositing a lower electrode on the substrate having the shadow mask to form a lower electrode layer;
   flattening the lower electrode layer;
   depositing an organic material on the flattened lower electrode layer to form an organic layer; and
   depositing an upper electrode on the organic layer to form an upper electrode layer;
   wherein the flattening is performed by both thermal treatment and plasma treatment simultaneously; and
   the thermal treatment is performed at 380° C.; and
   the plasma treatment is performed by oxygen plasma treatment with the condition of a power 150 (W), O$_2$ flow 50 (sccm), pressure 20 (mtorr), and time 90 (sec).

2. The method of claim 1, further comprising depositing an insulating film on the flattened lower electrode layer.

3. The method of claim 2, wherein the insulating film is any one selected from among PI (Polyimide), Al2O3, SiO2 and SiNx insulating films.

4. The method of claim 1, wherein the lower electrode layer is an ITO (Indium Tin Oxide) film layer.

5. An organic light emitting device manufactured by the method of claim 1 and having reduced leakage current.

* * * * *